United States Patent
Wu et al.

(10) Patent No.: US 8,048,750 B2
(45) Date of Patent: Nov. 1, 2011

(54) METHOD TO ENHANCE CHANNEL STRESS IN CMOS PROCESSES

(75) Inventors: Zhiqiang Wu, Plano, TX (US); Xin Wang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/357,712

(22) Filed: Jan. 22, 2009

(65) Prior Publication Data

US 2009/0227084 A1  Sep. 10, 2009

Related U.S. Application Data

(60) Provisional application No. 61/035,211, filed on Mar. 10, 2008.

(51) Int. Cl.
  *H01L 21/336* (2006.01)
(52) U.S. Cl. ........................ 438/293; 438/308
(58) Field of Classification Search ................. 438/659, 438/197, 293, 308
  See application file for complete search history.

(56) References Cited

U.S. PATENT DOCUMENTS

| | | | |
|---|---|---|---|
| 5,731,239 A * | 3/1998 | Wong et al. | 438/296 |
| 6,582,995 B2 * | 6/2003 | Hsieh et al. | 438/143 |
| 7,052,946 B2 * | 5/2006 | Chen et al. | 438/199 |
| 2005/0236667 A1 * | 10/2005 | Goto et al. | 257/344 |
| 2007/0281413 A1 * | 12/2007 | Li et al. | 438/201 |
| 2008/0113480 A1 * | 5/2008 | Nishida et al. | 438/278 |
| 2008/0135873 A1 * | 6/2008 | Fiorenza et al. | 257/190 |

OTHER PUBLICATIONS

Wang, G.H. et al, "Silicon-Germanium-Tin (SiGeSn) Source and Drain Stressors formed by Implant and Laser Annealing for Strained Silicon-Germanium Channel P-MOSFETs" ; Dec. 2007 Electron Devices Meeting, 2007 IEEE International, p. 131-134.*
Xin Wang and J. Wu, "Progress in Modeling of SMT 'Stress Memorization Technique' and Prediction of Stress Enhancement by a Novel PMOS SMT Process," IEEE Xplore, pp. 117-120.
Xin Wang and J. Wu, "Progress in Modeling of SMT 'Stress Memorization Technique' and Prediction of Stress Enhancement by a Novel PMOS SMT Process," IEEE Xplore, pp. 117-120, Sep. 11, 2008 International Conference on Simulation of Semiconductor Processes and Devices.

* cited by examiner

*Primary Examiner* — Charles Garber
*Assistant Examiner* — Bryan Junge
(74) *Attorney, Agent, or Firm* — Jacqueline J. Garner; Wade J. Brady, III; Frederick J. Telecky, Jr.

(57) ABSTRACT

The invention provides a method of fabricating a semiconductor device that enhances the amount of stress that is transmitted to the channel region for carrier mobility enhancement. In one embodiment an amorphous region is formed at or near the gate dielectric interface prior to source/drain anneal. In a second embodiment the gate material is amorphous as deposited and processing temperatures are kept below the gate material crystallization temperature until stress enhancement processing has been completed. The amorphous gate material deforms during high temperature anneal and converts from an amorphous to a polycrystalline phase allowing more stress to be transmitted into the channel region. This enhances carrier mobility and improves transistor drive current.

13 Claims, 3 Drawing Sheets

US 8,048,750 B2

METHOD TO ENHANCE CHANNEL STRESS IN CMOS PROCESSES

FIELD OF THE INVENTION

This invention is directed in general to a semiconductor device, and more specifically, to a semiconductor device fabricated using a process to improve transistor performance by enhancing channel stress.

BACKGROUND OF THE INVENTION

As technology scales, transistor performance has not improved accordingly. In order to increase transistor performance, various processes have been implemented to apply stress to the channel region to enhance carrier mobility. One method for PMOS transistors is to remove silicon from the source and drain regions and replace it with epitaxially grown silicon germanium, SiGe. Germanium is a larger atom than silicon so compressive stress is applied to the PMOS channel region. Also, compressive overlayers are deposited over PMOS transistors to apply stress to the channel region resulting in enhanced hole mobility. For NMOS transistors, silicon is removed from the source and drain regions and replaced with epitaxially grown silicon carbide, SiC. Carbon is a smaller atom than silicon so tensile tress is applied to the NMOS channel region. Tensile overlayers also are deposited on NMOS transistors to apply stress to the channel region resulting in enhanced electron mobility. A method to enhance the effectiveness of transmitting stress to the channel region to improve carrier mobility is therefore, desirable.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The instant invention provides a method of fabricating a semiconductor device, comprising forming an amorphous region in the gate stack in close proximity to the gate dielectric prior to source/drain anneal. Unlike crystalline or polycrystalline gate material the amorphous layer may deform during source and drain anneal enabling more of the stress to be transmitted to the channel region. This additional stress enhances carrier mobility thus improving the drive current of the transistor.

In a first embodiment an amorphous region is formed in the gate material prior to source/drain anneal.

In a second embodiment, an amorphous gate is deposited and subsequent temperatures are kept sufficiently low to prevent crystallization of the amorphous material prior to the source/drain anneal.

DETAILED DESCRIPTION

Figure 1A:
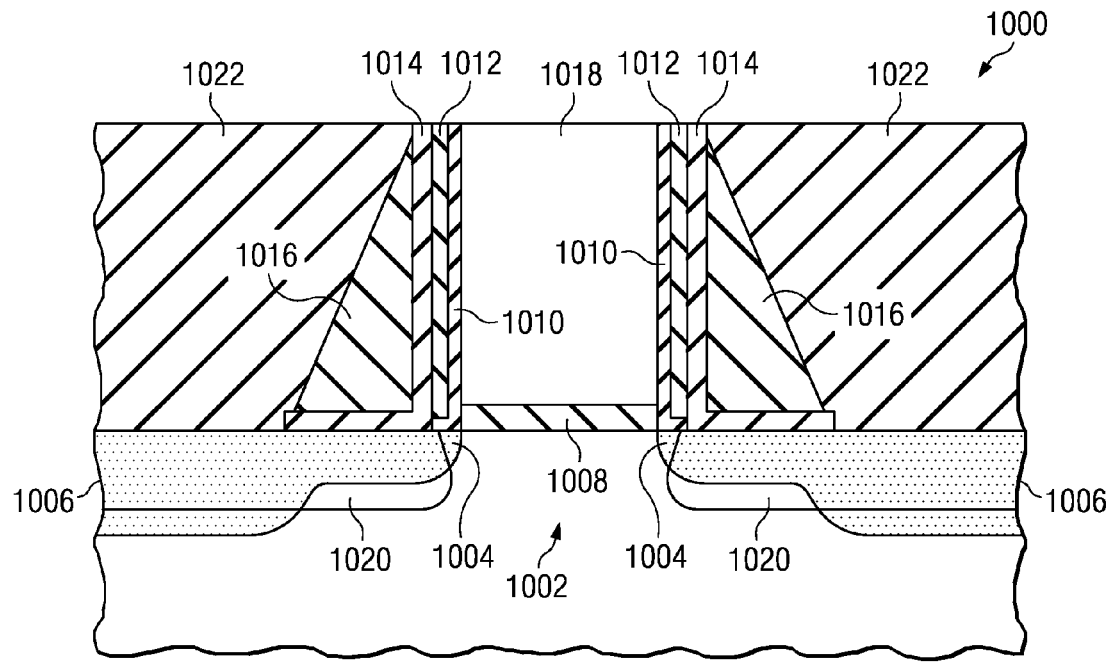
FIG. 1A through FIG. 1D are illustrations of steps in the fabrication of integrated circuits incorporating the first embodiment this invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The present invention is somewhat based upon the unique acknowledgement that semiconductor device performance may be dramatically increased by maximizing the stress in the channel region in a semiconductor device. Given this acknowledgement, the present invention recognized that a gate stack composed of deformable material would allow more stress to be introduced into the channel region during subsequent high temperature anneals such as source/drain anneal. In the first embodiment of this invention, the gate material is converted from crystalline or polycrystalline material to amorphous material prior to the source/drain anneal. In a second embodiment of this invention, the gate stack material is amorphous as deposited and subsequent processing temperatures are kept sufficiently low to avoid crystallization until after stress inducing layers have been deposited or grown.

FIG. 1A shows a transistor (1000) that has been partially processed through source/drain anneal. The transistor includes a channel region (1002), a gate dielectric (1008), a polysilicon gate region (1018), offset oxide (1010) and nitride (1012) spacers, sidewall oxide (1014) and nitride (1016) spacers, drain extensions (1004), source/drain regions (1006) and source/drain stress enhancement regions (1020). All the structures listed are formed using conventional processing. The stress enhancement region (1020) may be SiGe for PMOS transistors or SiC for NMOS transistors. Polysilicon gates are shown for illustrative purposes, but other crystalline or polycrystalline gate material would also benefit from this invention. Layer (1022) has then been deposited and planarized to expose or nearly expose the top of gate (1018). One method is to deposit a sacrifical oxide or nitride film and then to planarize the film using chemical mechanical polishing (CMP) to expose or nearly expose the tops of the gates. Another method might be to spin-on a sacrificial planarizing layer and then to either etch the layer or CMP the layer to expose or nearly expose the tops of the gates.

Figure 1B:
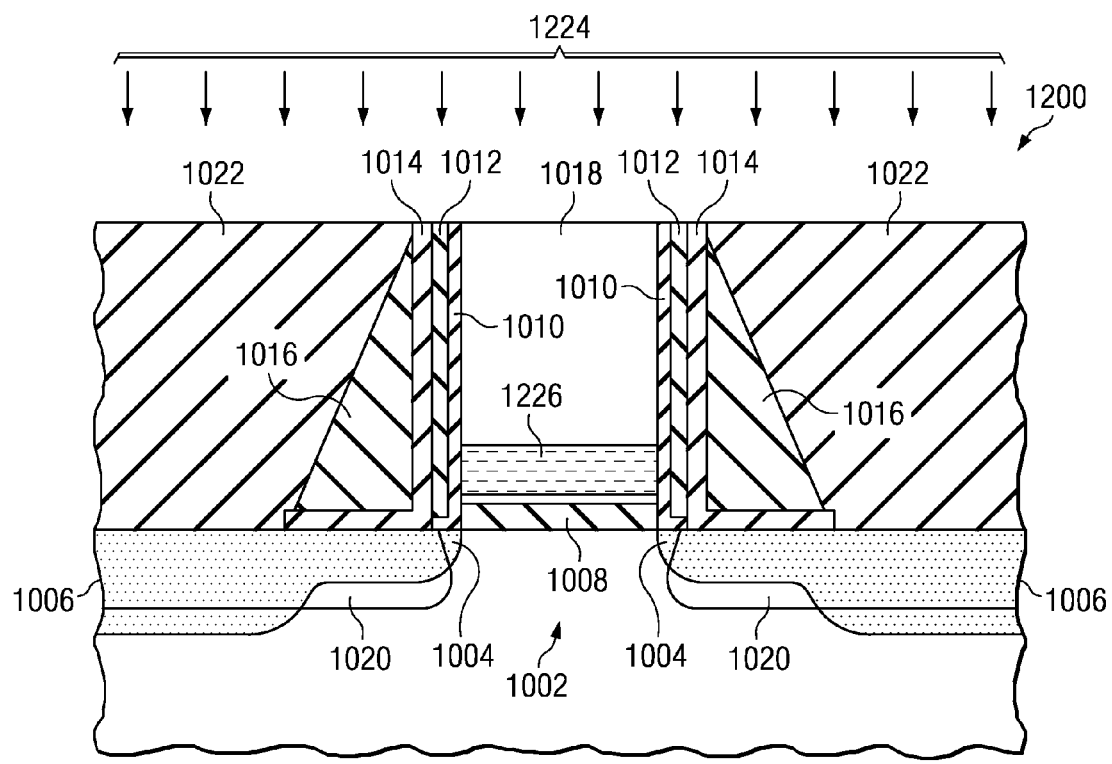

As shown in FIG. 1B, a species is then implanted (1224) to form an amorphous region (1226) in the gate stack (1018) with the lower boundary extending to within 20 nanometers or less of the gate dielectric (1008) interface. Implant ions such as but not limited to indium, silicon, or germanium may be used. In the preferred embodiment where the gate stack is 70 nm thick polysilicon, the implanted species is germanium with a dose ranging from 2e13 cm-2 to 5e15 cm-2 and energy ranging from 20 to 100 Kev. Thickness of the amorphous layer (1226) may be 1 to 40 nanometers for maximum benefit. In the preferred embodiment the thickness is 20 nm. A thicker layer is neither detrimental nor beneficial. The planarized layer (1022) blocks the implant (1224) from degrading the source/drain regions (1006) while allowing an amorphized region (1226) of the gate stack (1018) to be formed. Although it is not shown, it is understood that this amorphizing implant (1224) could be performed as a patterned implant so that an amorphous region (1226) is formed in either the NMOS or the PMOS gates only.

Figure 1C:
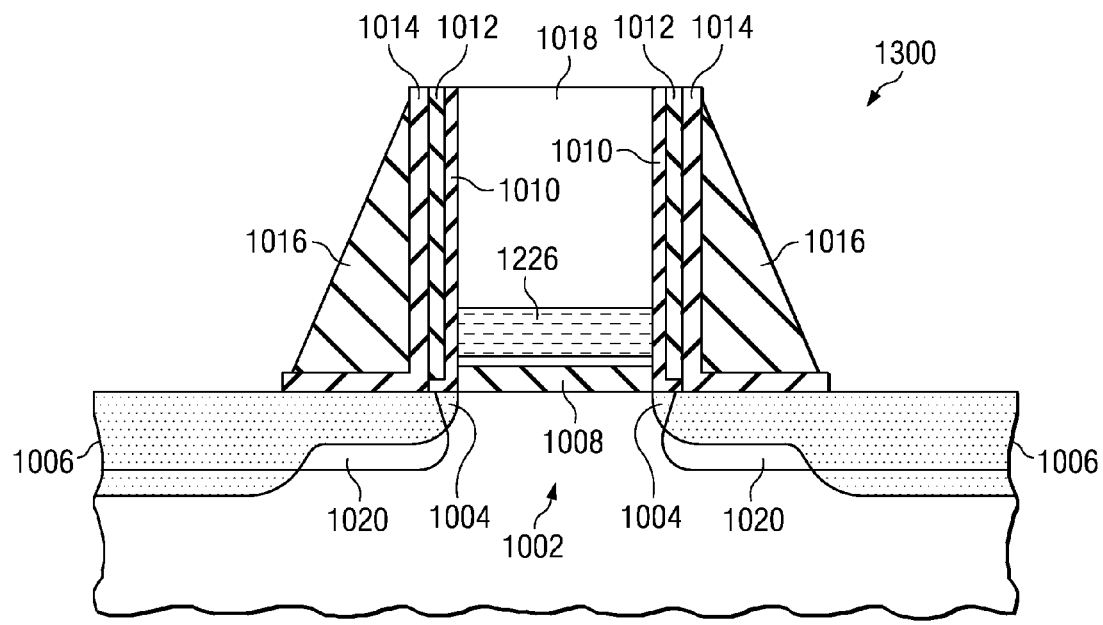

Planarizing layer (1022) is then removed using conventional techniques such as dry or wet etch. The structure (1300) shown in FIG. 1C is now ready to continue processing using a conventional semiconductor process flow. The amorphous material in the gate (1226) deforms to relieve stress as it converts from amorphous to crystalline or polycrystalline during the high temperature of the source/drain anneal. This transmits more stress to the channel region enhancing carrier mobility and improving transistor drive current.

Figure 1D:
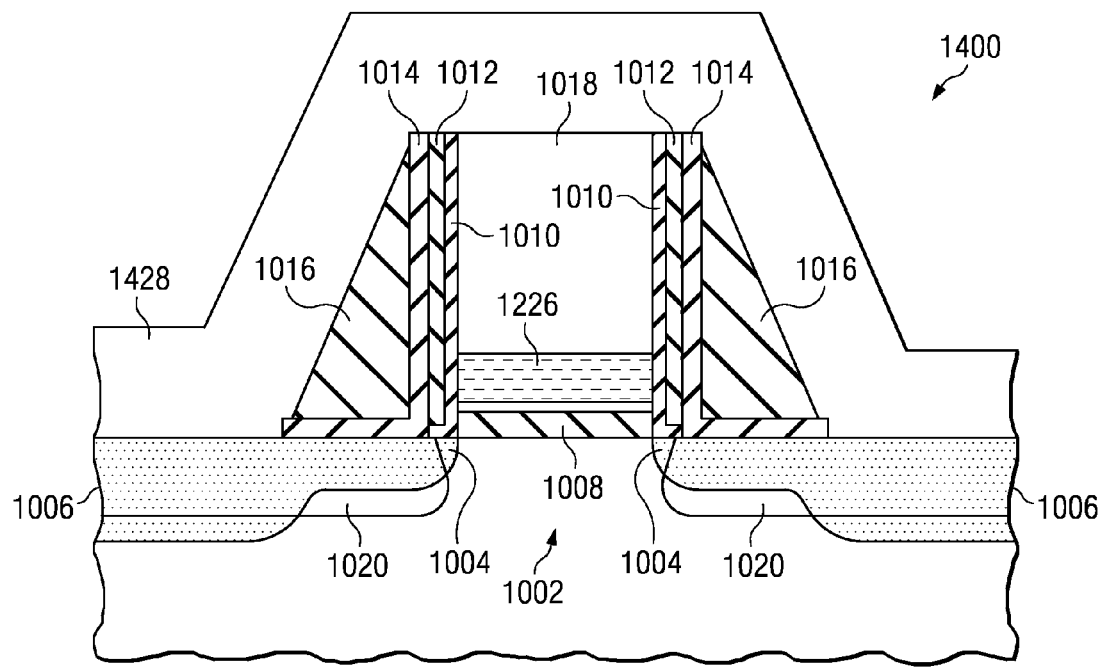

As shown in FIG. 1D, a stress memorization layer, SMT, (1428) may be deposited prior to source/drain anneal to further increase channel (1002) stress. The transistor structure shown in FIG. 1D has both source and drain stress enhancement regions (1020) as well as stress memorization layer (1428). A transistor structure with only the source/drain stress enhancement regions (1020) or only the stress memorization layer (1428) also benefits using this invention. Although benefit is shown when used with source and drain stress enhancement regions (1020) and when used with stress memorization layer (1428), any method that applies stress to the channel region prior to source/drain anneal would benefit from this invention.

Figure 2:
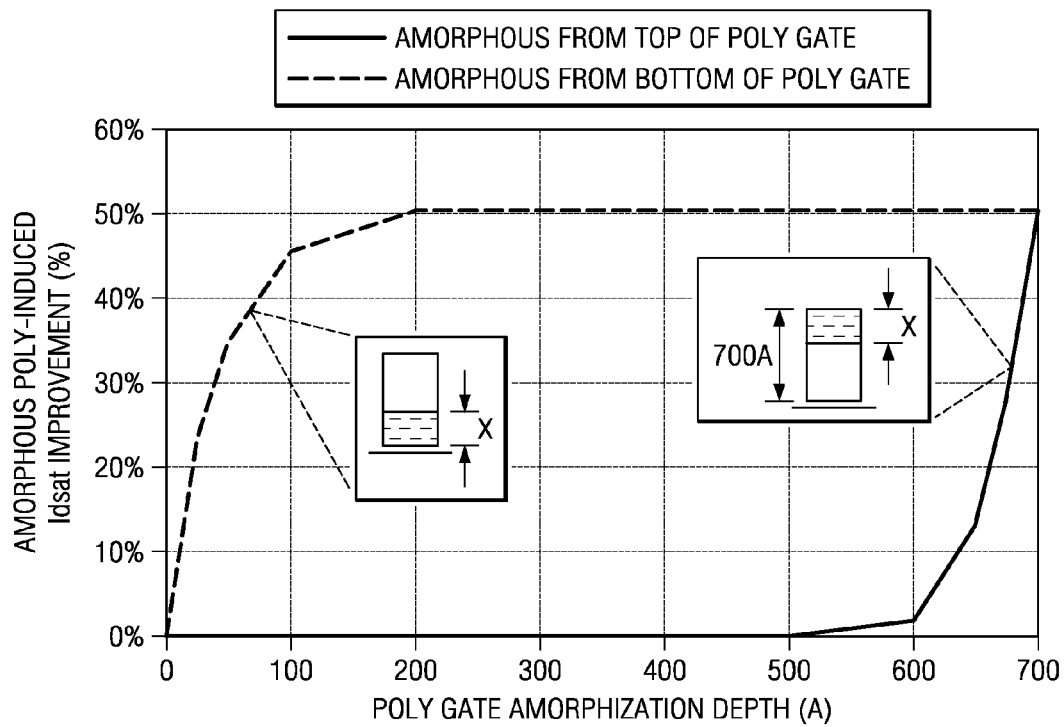
FIG. 2 is a graph of the simulated improvement in drive current of a PMOS transistor with a polysilicon gate and SiGe stress enhancement vs the amorphization depth and proximity to the gate dielectric according to this invention.

FIG. 2 is a graph of simulation results showing the improvement in PMOS transistor drive current that may be achieved by introducing an amorphous layer into a polysilicon gate prior to source and drain anneal. Up to to a 50% increase in drive current may be achieved if 20 nanometers of the polysilicon gate stack that is closest to the channel region is amorphous prior to the source/drain anneal.

Figure 3:
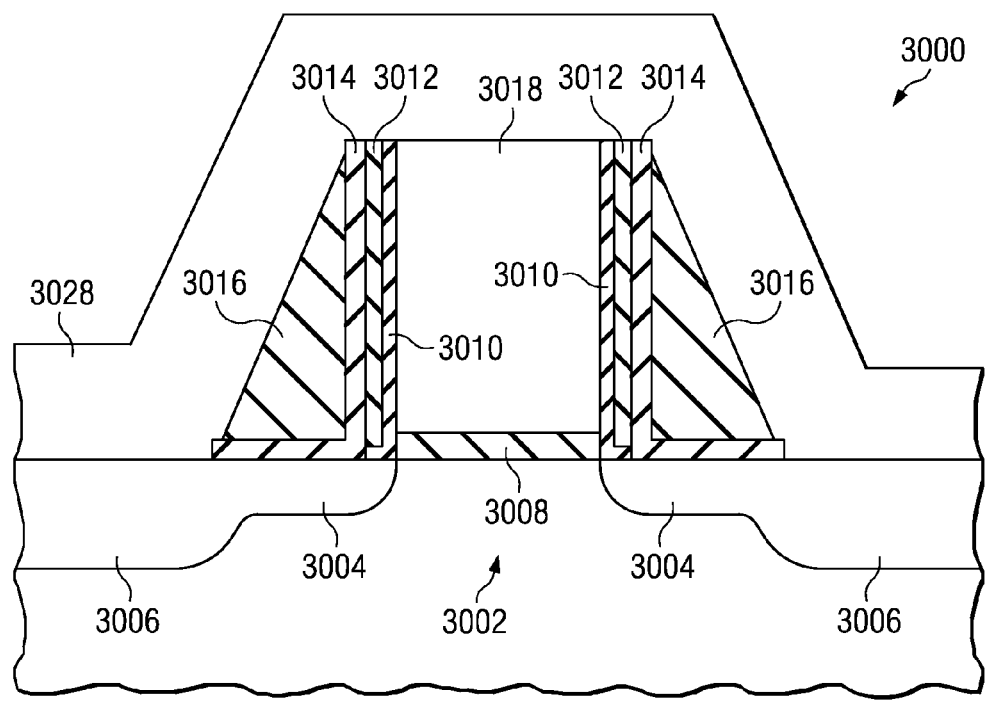
FIG. 3 is an illustration of steps in the fabrication of integrated circuits incorporating the second embodiment of this invention.

Another embodiment of this invention is shown in FIG. 3. Transistor (3000) has been partially processed up to but not including source/drain anneal. The transistor includes a channel region (3002), a gate dielectric (3008), an amorphous silicon gate region (3018), offset oxide (3010) and nitride (3012) spacers, sidewall oxide (3014) and nitride (3016) spacers, drain extensions (3004), and source/drain regions (3006). Unlike the first embodiment where the gate material (3018) is polysilicon, in this embodiment the gate material (3018) is amorphous silicon as deposited. Dielectric layers 3010, 3012, 3014 and 3016 are deposited or grown at temperatures sufficiently low (at or below about 560 C) to avoid crystallization of the amorphous silicon. A stress memorization film (or dual stress memorization films with compressive for PMOS and tensile for NMOS) (3028) may then be deposited with temperature at or below about 560 C prior to the high temperature source/drain anneal. The gate material (3018) and the channel region (3002) are under high stress due to the stress memorization layer (3028). The amorphous gate material (3018) deforms to relieve stress as it converts from amorphous to polycrystalline during the high temperature of the source/drain anneal. This transmits more stress to the channel region (3002) enhancing carrier mobility and improving transistor drive current. Stress memorization layer (3028) has been introduced to illustrate this embodiment, but it is understood that any method that applies stress to the channel region with a processing temperature below the amorphous silicon crystallization temperature can be used.

What is claimed is:

1. A method of fabricating an integrated circuit, comprising:
   providing a partially processed silicon substrate with a gate and a channel region formed thereon;
   implanting a source and drain region;
   depositing a sacrificial layer over said silicon substrate;
   planarizing said sacrifical layer;
   prior to annealing said source and drain region, implanting said gate with a species to amorphize a lower portion of said gate;
   removing said sacrificial layer;
   applying stress to said channel region; and
   with said lower portion of said gate in an amorphous state, perform an anneal of said source and drain regions wherein said anneal converts said lower amorphous portion of said gate to polycrystalline material, wherein said amorphized lower portion of said gate is 2 nm to 20 nm thick.

2. The method in claim 1 in which the implant species is selected from a group consisting of
   silicon;
   germanium; and
   indium.

3. The method in claim 1 in which said gate material is polysilicon.

4. The method in claim 1 in which lower surface of said amorphized lower portion of said gate is within 20 nm of a gate dielectric.

5. The method in claim 1 in which said amorphous portion of said gate touches a gate dielectric.

6. The method of claim 1 in which a transistor is PMOS and said source and drain regions comprise SiGe to apply said stress to said channel region.

7. The method of claim 1 in which a transistor is PMOS and further comprises implanting a stress enhancing species into said source and drain regions.

8. The method of claim 7 in which said stress enhancing species is Sn.

9. The method of claim 1 in which a transistor is NMOS and said source and drain regions comprise SiC to apply said stress to said channel region.

10. The method of claim 1 in which a transistor is NMOS and further comprises implanting a stress enhancing species into said source and drain regions.

11. The method of claim 10 in which said stress enhancing species is carbon.

12. The method of claim 1 in which a transistor is PMOS and a compressive stress overlayer is deposited prior to source/drain anneal to apply said stress to said channel region.

13. The method of claim 1 in which a transistor is NMOS and a tensile stress overlayer is deposited prior to said source and drain anneal to apply said stress to said channel region.

* * * * *